(12) United States Patent
Chen et al.

(10) Patent No.: US 11,531,077 B2
(45) Date of Patent: Dec. 20, 2022

(54) COOLING STRUCTURE OF GRADIENT COIL HAVING FLEXIBLE COOLANT PIPELINES

(71) Applicant: Siemens Healthcare GmbH, Erlangen (DE)

(72) Inventors: Xiao Feng Chen, GuangZhou (CN); Wei Ping Peng, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/132,342

(22) Filed: Dec. 23, 2020

(65) Prior Publication Data

US 2021/0199740 A1    Jul. 1, 2021

(30) Foreign Application Priority Data

Dec. 26, 2019  (CN) .......................... 201911366124.0

(51) Int. Cl.
*G01R 33/385*        (2006.01)
(52) U.S. Cl.
CPC ................................ *G01R 33/3856* (2013.01)

(58) Field of Classification Search
CPC .......................... G01R 33/3856; G01R 33/385
See application file for complete search history.

(56) References Cited

U.S. PATENT DOCUMENTS

| | | | |
|---|---|---|---|
| 6,011,394 A * | 1/2000 | Petropoulos | G01R 33/4215 324/318 |
| 6,111,412 A | 8/2000 | Boemmel et al. | |
| 2020/0057127 A1* | 2/2020 | Pan | G01R 33/3856 |

* cited by examiner

*Primary Examiner* — Jay Patidar
(74) *Attorney, Agent, or Firm* — Banner & Witcoff Ltd.

(57) ABSTRACT

The cooling component may include a coolant pipeline component and a load-bearing component. The coolant pipeline component may include multiple flexible coolant pipelines with high thermal conductivity arranged side by side, the multiple coolant pipelines arranged side by side being securely arranged on the load-bearing component in such a way that a coolant liquid intake pipe and liquid output pipe are arranged uniformly in parallel in a serpentine layout without crossing over each other; so that the multiple coolant pipelines can be installed in a close fit with a Z coil of a gradient coil in such a way as to be orthogonal to the Z coil. Aspects of the present disclosure advantageously increase the support roundness of a cooling layer, and further ensure the magnetic field homogeneity of a coil supported thereby.

19 Claims, 5 Drawing Sheets

COOLING STRUCTURE OF GRADIENT COIL HAVING FLEXIBLE COOLANT PIPELINES

CROSS REFERENCE TO RELATED APPLICATIONS

This patent application claims priority to Chinese (CN) Patent Application No. 201911366124.0, filed Dec. 26, 2019, which is incorporated herein by reference in its entirety.

BACKGROUND

Field

The present disclosure relates to the field of gradient coil cooling, in particular a gradient coil cooling component and a gradient coil.

Related Art

In a magnetic resonance imaging (MRI) system, gradient coils are used to generate gradient fields which are switched frequently. During operation of the gradient coils, the currents required reach several hundred amperes, and therefore cause a large amount of heat to be generated in the coils. If effective cooling measures are not adopted, there is a possibility that the gradient coils will burn out, and a gradient amplifier will stop operating due to device overheating. Gradient coils for the X, Y and Z axes are encapsulated and fixed in an insulating material, and at the same time are arranged closely in the magnet aperture; objective conditions for relying on natural heat dissipation to the environment and heat dissipation by air cooling are lacking, so it is necessary to cool the gradient coils promptly.

Conventionally, a flexible coolant pipe having high thermal conductivity may be installed in the interior of the gradient coils, in order to perform cooling.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 5A is an axial sectional drawing, and FIG. 5B is a radial sectional drawing.

Figure 1:
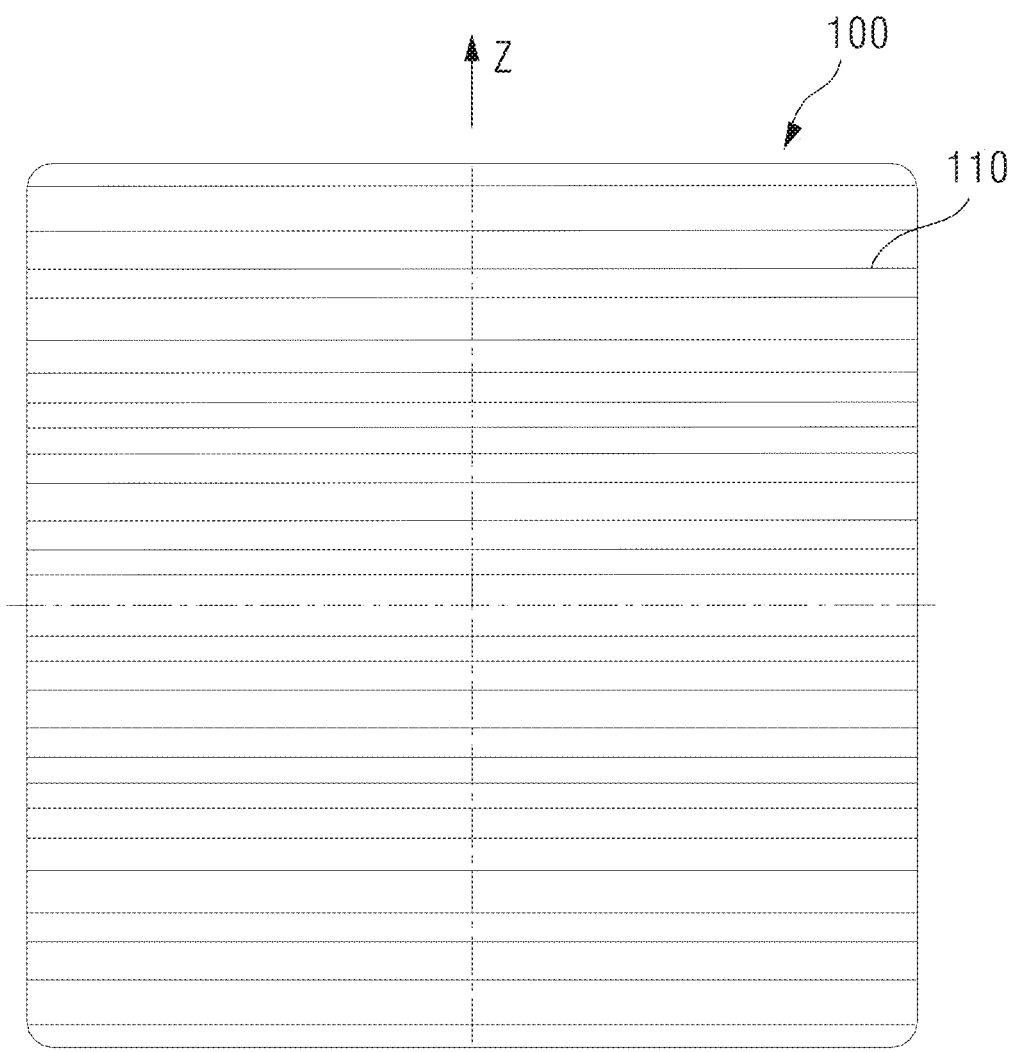
FIG. 1 is a schematic diagram of an example manner of arranging a Z coil.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

In view of the above, in embodiments of the present disclosure, a gradient coil cooling component is proposed in one aspect, and a gradient coil is proposed in another aspect, for the purpose of increasing the support roundness of a cooling layer, and further ensuring the magnetic field homogeneity of a coil supported thereby.

The gradient coil cooling component proposed in embodiments of the present disclosure comprises: a coolant pipeline component and a load-bearing component, wherein the coolant pipeline component comprises: multiple flexible coolant pipelines with high thermal conductivity arranged side by side, the multiple coolant pipelines arranged side by side being securely arranged on the load-bearing component in such a way that a coolant liquid intake pipe has a serpentine layout and a liquid output pipe is arranged in parallel at one side of the liquid intake pipe without crossing over the liquid intake pipe; so that the multiple coolant pipelines can be installed in a close fit with a Z coil of a gradient coil in such a way as to be orthogonal to the Z coil.

In one embodiment, the load-bearing component comprises multiple load-bearing plates having a set gap therebetween, and the multiple coolant pipelines arranged side by side are stitched onto the multiple load-bearing plates by means of stitching lines.

In one embodiment, the multiple load-bearing plates comprise a first end plate, a second end plate and a middle plate, wherein bends of the serpentine shape of the multiple coolant pipelines arranged side by side are stitched onto the corresponding first end plate or second end plate using the stitching lines; and middle positions, which are not bends, of the multiple coolant pipelines arranged side by side are stitched onto the middle plate using the stitching lines.

In one embodiment, pipeline parts at a coolant liquid inlet side and a coolant liquid outlet side of the coolant pipelines are stitched onto the first end plate by means of the stitching lines.

In one embodiment, the load-bearing component is realized using an epoxy board, a non-magnetic plastic or a composite material.

In one embodiment, the Z coil is a shield coil or a main coil.

The gradient coil proposed in embodiments of the present disclosure comprises: a gradient coil body, and is characterized by further comprising the cooling component in any one of the embodiments above, the cooling component being installed in a close fit with a Z coil in the gradient coil body in such a way as to be orthogonal thereto.

In one embodiment, the gradient coil body comprises a main coil and a shield coil; and the Z coil is a Z coil in the shield coil or a Z coil in the main coil.

In one embodiment, the main coil and the shield coil each further comprise an X coil and a Y coil; and if the cooling component is denoted C, then the installation position of the cooling component in the shield coil or the installation position of the cooling component in the main coil is any one of the following manners of installation: CZXY, CZYX, ZCXY, ZCYX, XYCZ, YXCZ, XCZY, YCZX, XZCY and YZCX.

It can be seen from the solution above that since the copper wire of the Z coil and the coolant pipeline are arranged orthogonally to each other in embodiments of the present disclosure, the Z coil can support the cooling component very well, so the cooling component will not experience collapse; this ensures the roundness of the cooling component and a coil supported thereby, and it is thereby possible to ensure the magnetic field homogeneity of the supported coil. In addition, in embodiments of the present disclosure, when the multiple coolant pipelines arranged side by side are arranged in the serpentine layout, the bending radius of the pipes can be configured to be large, so as to avoid large pressure drops; moreover, as the coolant liquid intake pipe and liquid output pipe are arranged in a parallel, serpentine layout without crossing over each other, coolant of the entire cooling component can uniformly carry away heat generated by the Z coil.

Furthermore, due to the fact that the load-bearing component used to bear the coolant pipelines is realized using three small load-bearing plates, the coolant pipelines between two epoxy boards can come into direct contact with the Z coil, and this makes it easier for heat generated by the Z coil to be carried away.

The cooling component in embodiments of the present disclosure is arranged simply, has a low cost, is convenient to operate, reduces the assembly process time, and when the load-bearing component is realized using more than one load-bearing plate, the cooling load-bearing structure is simplified, thus reducing costs. Installation of the cooling component in embodiments of the present disclosure has no effect on the design of current gradient coils.

In embodiments of the present disclosure, account is taken of the fact that a coil body of a gradient coil generally comprises a main coil and a shield coil, which in turn each comprise X, Y and Z coils. Furthermore, different gradient coils might have different internal structures; for example, the layout of the X, Y and Z coils of the main coil or the shield coil may have different layout sequences according to actual circumstances, e.g. the layout of the main coil from inside to outside may be XYZ, YXZ, ZXY, ZYX, XZY or YZX, and the layout of the shield coil from inside to outside may be ZXY, ZYX, XYZ, YXZ, XZY or YZX. A flexible coolant pipeline layer (cooling layer for short, denoted C hereinbelow) used for cooling the gradient coil may be arranged in the interior of the gradient coil according to actual circumstances, e.g. XYCZ, XCYZ, YXCZ, CZXY, CZYX, ZCXY, ZCYX, ZXCY, ZYCX, XYZC, ZCXYC, XYCZC, XCYCZC, ZCXCYC, etc.

In embodiments of the present disclosure, the inventors have found through research that due to the fact that the X and Y coils are generally arranged in a fingerprint pattern, when the cooling layer is arranged above the X coil or Y coil, it can generally be supported by the X coil or Y coil very well, and thus have its roundness ensured, regardless of the way in which it is coiled; at the same time, when it serves a supporting layer for the Y coil or X coil, it can also ensure the roundness of the supported coil, due to the way in which the Y coil or X coil itself is arranged. However, in the case where the cooling layer is in a close fit with the Z coil, due to the fact that the Z coil is generally arranged helically as shown in FIG. 1, with a copper wire 110 of the Z coil 100 in FIG. 1 being arranged helically around the Z direction, when the cooling layer is located above the Z coil, if all or part of the pipeline arranged therein is parallel to all or part of the copper wire of the Z coil, the coolant pipe might fall into a gap between two adjacent wires of the Z coil when the cooling layer is arranged, resulting in local collapse, and thus affecting the roundness of the cooling layer; and if there is also a supported coil above the cooling layer at this time, the roundness and magnetic field homogeneity of the coil supported by the cooling layer will be further affected. The same is true in the opposite scenario: when the cooling layer is located below the Z coil, if all or part of the pipeline arranged therein is parallel to all or part of the copper wire of the Z coil, the Z coil will similarly experience local collapse when the Z coil is arranged, thus affecting the roundness of the Z coil, and further affecting the roundness and magnetic field homogeneity of a coil (if present) above the Z coil.

Thus, in embodiments of the present disclosure, consideration is given to a configuration in which the cooling layer is preferably arranged in a manner orthogonal to the arrangement of the Z coil when the cooling layer is in a close fit with the Z coil, regardless of whether it is located above or below the Z coil, in order to ensure the roundness of the cooling layer and the roundness of the coil supported thereby, and in turn ensure the magnetic field homogeneity of the supported coil.

In order to clarify the object, technical solution and advantages of the present disclosure, the present disclosure is explained in further detail below by way of embodiments.

Figure 2:
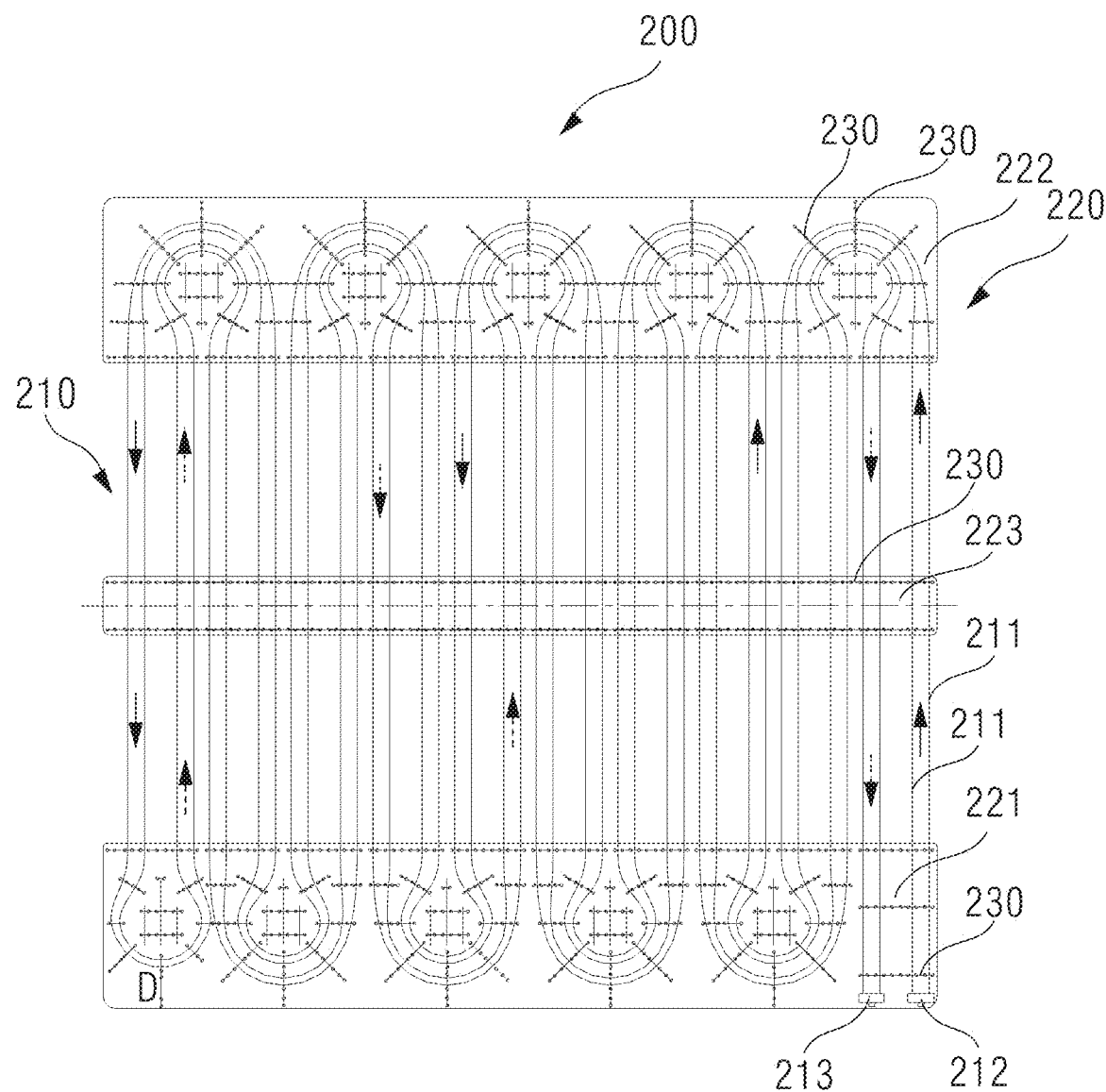
FIG. 2 is a structural schematic diagram of a gradient coil cooling component according to an exemplary embodiment of the present disclosure.
Figure 3:
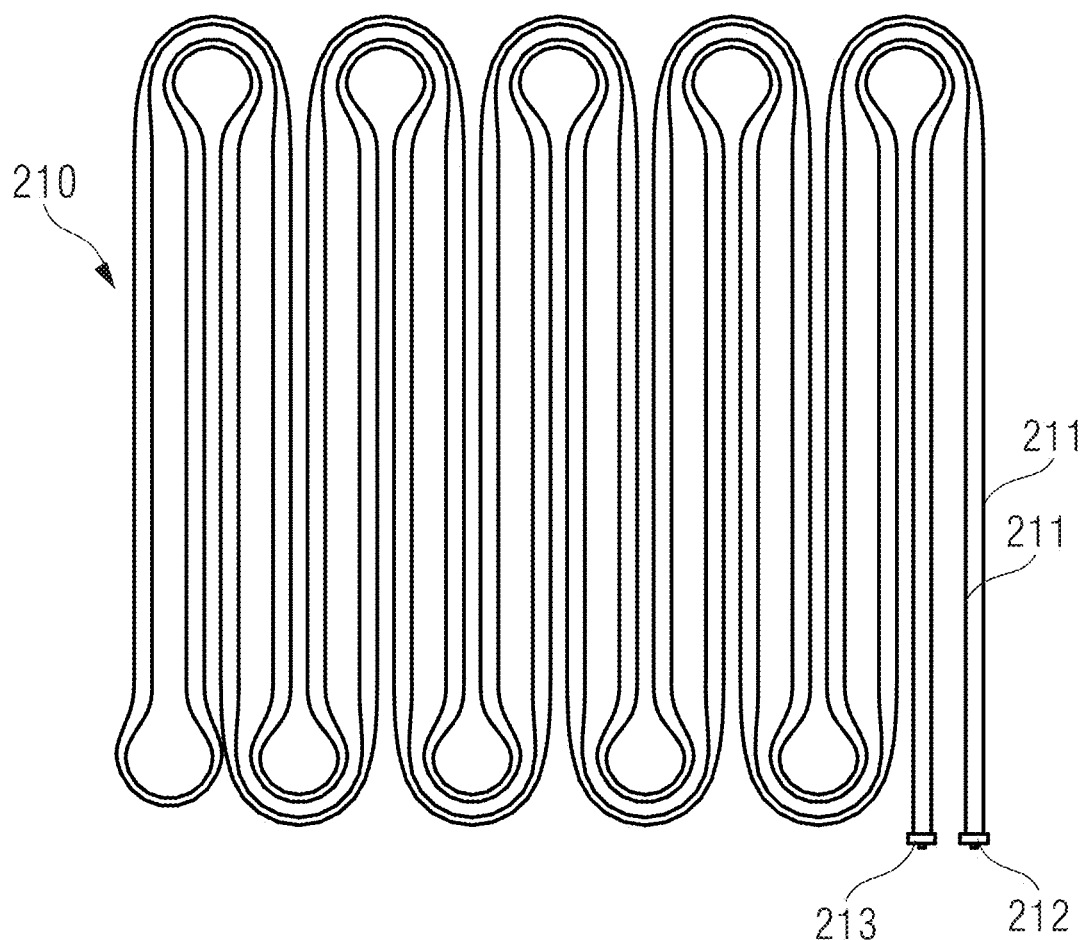
FIG. 3 is a structural schematic diagram of a coolant pipeline component in FIG. 2.

FIG. 2 is a structural schematic diagram of a gradient coil cooling component in an embodiment of the present disclosure. FIG. 3 is a structural schematic diagram of a coolant pipeline component in FIG. 2. Referring to FIGS. 2 and 3, the gradient coil cooling component 200 in an embodiment of the present disclosure comprises: a coolant pipeline component 210 and a load-bearing component 220.

The coolant pipeline component 210 comprises: multiple flexible coolant pipelines 211 (two by way of example in FIG. 2, i.e. one line represents one pipeline, and the case of two pipelines is shown) with high thermal conductivity arranged side by side (similar to being arranged in parallel), wherein the multiple coolant pipelines 211 arranged side by side may have one overall coolant liquid inlet 212 and one overall coolant liquid outlet 213. In this embodiment, the coolant liquid inlet 212 and coolant liquid outlet 213 are located at the same side. The multiple coolant pipelines 211 arranged side by side are further divided into a liquid intake pipe part and a liquid output pipe part, i.e. a pipeline part from the coolant liquid inlet 212 to a return flow turning point D in the direction of the solid-line arrows is called the liquid intake pipe part, abbreviated as liquid intake pipe, and a pipeline part from the return flow turning point D to the coolant liquid outlet 213 in the direction of the dotted-line arrows is called the liquid output pipe part, abbreviated as liquid output pipe; as can be seen, the liquid intake pipe and liquid output pipe are securely arranged on the load-bearing component 220 in a parallel serpentine layout without crossing over each other. That is, the liquid intake pipe is arranged in a serpentine layout, and the liquid output pipe is arranged in parallel at one side of the liquid intake pipe, without crossing over the liquid intake pipe.

In this embodiment, the load-bearing component 220 may comprise multiple load-bearing plates having a set gap therebetween; the multiple coolant pipelines 211 arranged side by side are stitched onto the multiple load-bearing plates by means of stitching lines 230. For example, FIG. 2 shows the case where three load-bearing plates are included, specifically a first end plate 221, a second end plate 222 and a middle plate 223. Bends of the serpentine shape of the multiple coolant pipelines 211 arranged side by side are stitched onto the corresponding first end plate 221 and second end plate 222 using the stitching lines 230; middle positions, which are not bends, of the multiple coolant pipelines 211 arranged side by side are stitched onto the middle plate 223 using the stitching lines 230. Pipeline parts at the coolant liquid inlet side and coolant liquid outlet side of the coolant pipelines 211 are also stitched onto the corresponding first end plate 221 by means of the stitching lines 230. In other embodiments, the load-bearing component 220 may also be one complete load-bearing plate, or comprise two load-bearing plates, or comprise another number of load-bearing plates. In particular implementation, corresponding stitching line holes may first be provided in each load-bearing plate.

The load-bearing component 220 is generally realized using an epoxy board (GRP), but of course may also be realized using a non-magnetic plastic or a composite material, e.g. a laminated plastic board and a glass fibre reinforced board, etc.

In particular implementation, the coolant pipelines 211 may be securely arranged on the load-bearing component 220 in multiple ways. Only one of these is shown in embodiments of the present disclosure.

Figure 4:
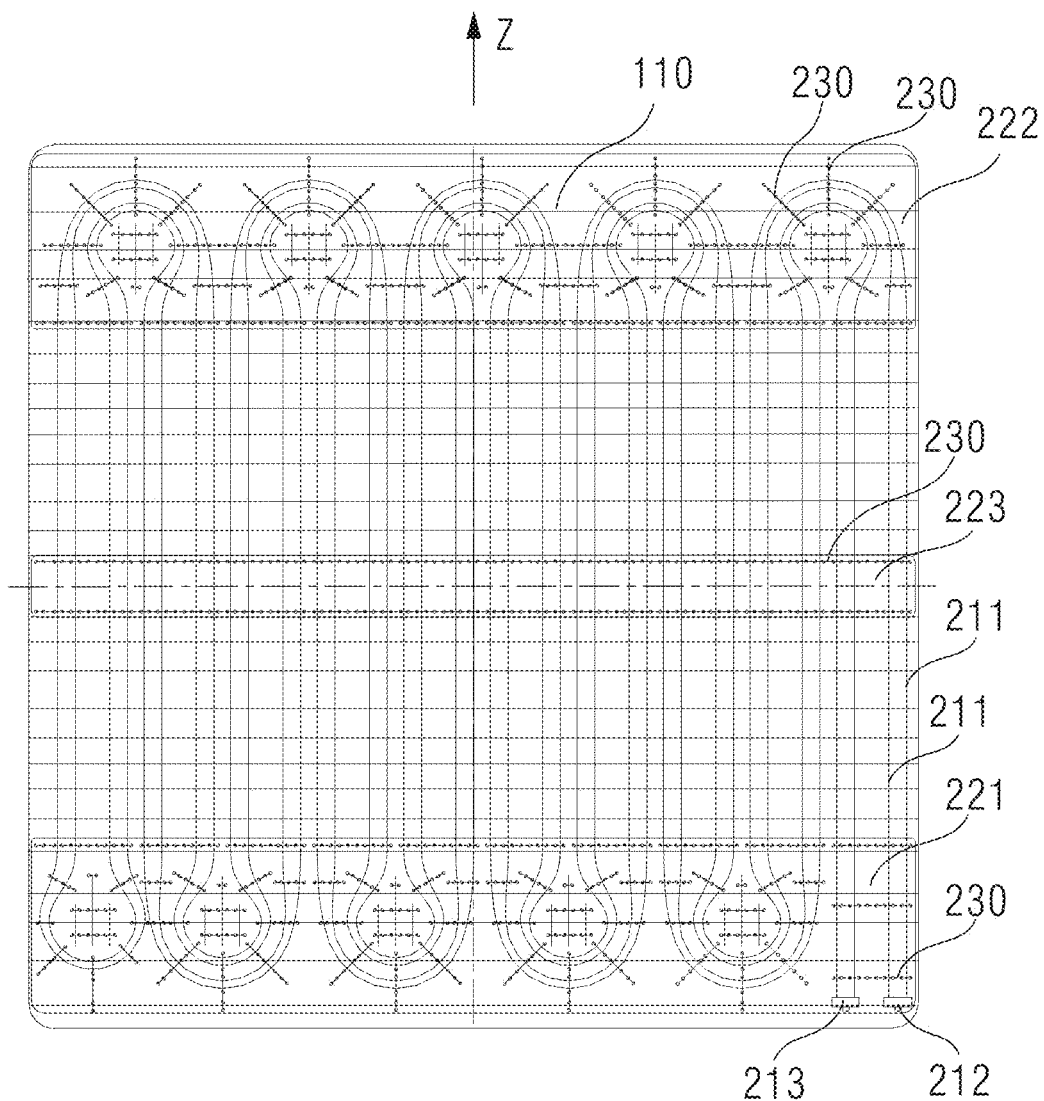
FIG. 4 is an opened-out schematic plan of a local structure of a gradient coil according to an exemplary embodiment of the present disclosure.
Figure 5A:
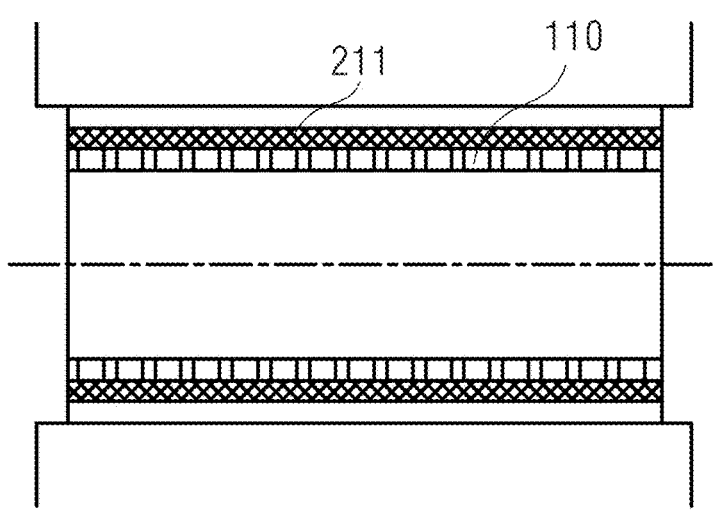
FIGS. 5A and 5B are schematic sectional drawings of local structures of a gradient coil according to an exemplary embodiment of the present disclosure, where
Figure 5B:
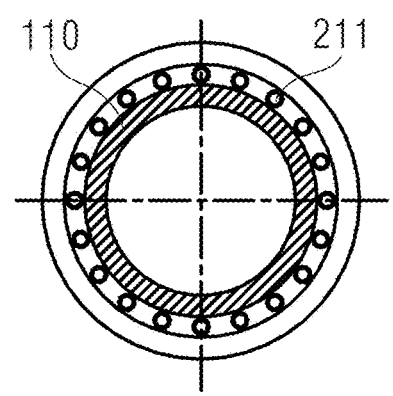

When it is necessary to install the cooling component 200 in the interior of the gradient coil, if it needs to be in a close fit with the Z coil, then the cooling component 200 can be installed in such a way that the coolant pipeline component 210 is orthogonal to the Z coil; for example, an opened-out schematic plan of a local structure of the gradient coil after the cooling component 200 shown in FIG. 2 has been installed in a closely fitting manner above the Z coil shown in FIG. 1 may be as shown in FIG. 4. Schematic sectional drawings of local structures of the gradient coil may be as shown in FIGS. 5A and 5B. FIG. 5A is an axial sectional drawing, and FIG. 5B is a radial sectional drawing. As shown in FIG. 4 and FIGS. 5A and 5B, the copper wire 110 of the Z coil 100 and the coolant pipeline 211 in the coolant pipeline component 210 are arranged so as to be orthogonal to each other, such that the Z coil 100 can support the cooling component 200 very well, and the cooling component 200 will not experience collapse; this ensures the roundness of the cooling component 200 and a coil supported thereby very effectively, and it is thereby possible to ensure the magnetic field homogeneity of the supported coil.

Of course, if the cooling component shown in FIG. 2 is not in a close fit with the Z coil, but instead is only in a close fit with the X coil or Z coil, then the roundness of the cooling component 200 can still be ensured.

The Z coil in embodiments of the present disclosure may be the Z coil in the shield coil, or the Z coil in the main coil. If the cooling component 200 is still labelled C, then the installation position of the cooling component 200 in the shield coil or the installation position of the cooling component in the main coil may be any one of the following manners of installation: CZXY, CZYX, ZCXY, ZCYX, XYCZ, YXCZ, XCZY, YCZX, XZCY and YZCX. Moreover, these manners of installation do not exclude the further inclusion of a cooling layer between adjacent X and Y or between adjacent X and Z or between Y and Z, and do not exclude the further inclusion of a cooling layer at the innermost layer and/or outermost layer. The abovementioned manners of installation are merely intended to illustrate the installation relationship between the cooling component 200 and the Z coil 100 in the present application.

Moreover, in embodiments of the present disclosure, when the multiple coolant pipelines 211 arranged side by side are arranged in the serpentine layout, the bending radius of the pipes can be configured to be large, so as to avoid large pressure drops. Furthermore, the uniform, parallel, serpentine layout of the coolant liquid intake pipe and liquid output pipe enables coolant of the entire cooling component to uniformly carry away heat generated by the Z coil. In addition, due to the fact that the load-bearing component 220 used to bear the coolant pipelines 211 is realized using three small load-bearing plates, the coolant pipelines between two epoxy boards can come into direct contact with the Z coil, and this makes it easier for heat generated by the Z coil to be carried away. Furthermore, the cooling component in embodiments of the present disclosure is arranged simply, has a low cost, is convenient to operate, reduces the assembly process time, and when the load-bearing component is realized using more than one load-bearing plate, the cooling load-bearing structure is simplified, thus reducing costs. Installation of the cooling component in embodiments of the present disclosure has no effect on the design of current gradient coils.

The embodiments above are merely preferred embodiments of the present disclosure, which are not intended to limit it. Any amendments, equivalent substitutions or improvements etc. made within the spirit and principles of the present disclosure shall be included in the scope of protection thereof.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

| Reference List | |
|---|---|
| 100 | Z coil |
| 110 | copper wire of Z coil |
| 200 | cooling component |
| 210 | coolant pipeline component |
| 211 | coolant pipeline |
| 212 | coolant liquid inlet |
| 213 | coolant liquid outlet |
| 220 | load-bearing component |
| 221 | first end plate |
| 222 | second end plate |
| 223 | middle plate |
| 230 | stitching line |

The invention claimed is:

1. A gradient coil cooling component, comprising:
a coolant pipeline component including multiple flexible coolant pipelines with high thermal conductivity arranged side by side, the multiple flexible coolant pipelines configured to be installed with a Z coil of a gradient coil so as to be orthogonal to components of the Z coil; and
a load-bearing component configured to be disposed on an outside of the Z coil of the gradient coil and including multiple load-bearing plates having a set gap therebetween,
wherein the multiple flexible coolant pipelines arranged side by side are stitched onto the multiple load-bearing plates bye stitching lines to securely arrange the multiple flexible coolant pipelines on the load-bearing component such that a coolant liquid intake pipe has a serpentine layout and a liquid output pipe is arranged in parallel at one side of the coolant liquid intake pipe without crossing over the coolant liquid intake pipe.

2. The gradient coil cooling component as claimed in claim 1, wherein:
the multiple load-bearing plates comprise a first end plate, a second end plate and a middle plate;
bends of the serpentine shape of the multiple flexible coolant pipelines arranged side by side are stitched onto the corresponding first end plate or second end plate using the stitching lines; and
middle, non-bending positions of the multiple flexible coolant pipelines arranged side by side are stitched onto the middle plate using the stitching lines.

3. The gradient coil cooling component as claimed in claim 2, wherein pipeline parts at a coolant liquid inlet side and a coolant liquid outlet side of the coolant pipelines are stitched onto the first end plate by the stitching lines.

4. The gradient coil cooling component as claimed in claim 2, wherein the middle plate is disposed between the first end plate and the second end plate.

5. The gradient coil cooling component as claimed in claim 1, wherein the load-bearing component is an epoxy board, a non-magnetic plastic, or a composite material.

6. The gradient coil cooling component as claimed in claim 1, wherein the Z coil is a shield coil.

7. The gradient coil cooling component as claimed in claim 1, wherein the components of the Z coil comprise copper wires.

8. The gradient coil cooling component as claimed in claim 1, wherein the components of the Z coil extend parallel to each other.

9. The gradient coil cooling component as claimed in claim 1, wherein the Z coil is a main coil.

10. A gradient coil, comprising:
a gradient coil body having a Z coil, and
a cooling component including:
a coolant pipeline component having multiple flexible coolant pipelines with high thermal conductivity arranged side by side, the multiple flexible coolant pipelines being installed with the Z coil so as to be orthogonal to components of the Z coil; and
a load-bearing component disposed on an outside of the Z coil of the gradient coil and including multiple load-bearing plates having a set gap therebetween,
wherein the multiple flexible coolant pipelines arranged side by side are stitched onto the multhle load-bearing plates by stitchino to securely arrange the multiple flexible coolant pipelines on the load-bearing component such that a coolant liquid intake pipe has a serpentine layout and a liquid output pipe is arranged in parallel at one side of the coolant liquid intake pipe without crossing over the coolant liquid intake pipe.

11. The gradient coil as claimed in claim 10, wherein the components of the Z coil extend parallel to each other.

12. The gradient coil as claimed in claim 10, wherein the components of the Z coil comprise copper wires.

13. The gradient coil as claimed in claim 10, wherein the cooling component is configured to be bent tangentially in a tangent direction that is orthogonal to a direction in which the flexible coolant pipelines extend.

14. The gradient coil as claimed in claim 13, wherein the direction in which the extend is orthogonal to the components of the Z coil.

15. The gradient coil as claimed in claim 10, wherein:
the multiple load-bearing plates comprise a first end plate, a second end plate and a middle plate;
bends of the serpentine shape of the multiple flexible coolant pipelines arranged side by side are stitched onto the corresponding first end plate or second end plate using the stitching lines; and
middle, non-bending positions of the multiple flexible coolant pipelines arranged side by side are stitched onto the middle plate using the stitching lines.

16. A gradient coil cooling component, comprising:
a coolant pipeline component including multiple flexible coolant pipelines with high thermal conductivity arranged side by side, the multiple flexible coolant pipelines configured to be installed with a Z coil of a gradient coil so as to be orthogonal to components of the Z coil; and
a load-bearing component including multiple load-bearing plates having a set gap therebetween, wherein the multiple load-bearing plates include a first end plate, a second end plate and a middle plate, wherein:

the multiple flexible coolant pipelines arranged side by side are stitched onto the multiple load-bearing plates by stitching lines to securely arrange the multiple flexible coolant pipelines on the load-bearing component such that a coolant liquid intake pipe has a serpentine layout and a liquid output pipe is arranged in parallel at one side of the coolant liquid intake pipe without crossing over the coolant liquid intake pipe;

bends of the serpentine shape of the multiple flexible coolant pipelines arranged side by side are stitched onto the corresponding first end plate or second end plate using the stitching lines; and middle, non-bending positions of the multiple flexible coolant pipelines arranged side by side are stitched onto the middle plate using the stitching lines.

17. The gradient coil cooling component as claimed in claim 16, wherein the middle plate is disposed between the first end plate and the second end plate.

18. The gradient coil cooling component as claimed in claim 16, wherein the components of the Z coil comprise copper wires.

19. The gradient coil cooling component as claimed in claim 16, wherein the components of the Z coil extend parallel to each other.

\* \* \* \* \*